United States Patent
Wu

(10) Patent No.: US 6,872,664 B2
(45) Date of Patent: Mar. 29, 2005

(54) DUAL GATE NITRIDE PROCESS

(75) Inventor: Yung Hsien Wu, Hsinchu (TW)

(73) Assignee: ProMOS Technologies, Inc., Hsinchu (TW)

( * ) Notice: Subject to any disclaimer, the term of this patent is extended or adjusted under 35 U.S.C. 154(b) by 0 days.

(21) Appl. No.: 10/600,699

(22) Filed: Jun. 23, 2003

(65) Prior Publication Data

US 2004/0178174 A1 Sep. 16, 2004

(30) Foreign Application Priority Data

Mar. 13, 2003 (TW) ........................................ 92105453 A

(51) Int. Cl.⁷ ............................................ H01L 21/302
(52) U.S. Cl. ........................ 438/699; 438/724; 438/757; 438/775
(58) Field of Search ................... 427/255.394; 438/699, 438/724, 757, 775

(56) References Cited

U.S. PATENT DOCUMENTS 5,445,990 A * 8/1995 Yook et al. ................ 438/443
6,551,883 B1 * 4/2003 Yen et al. ................... 438/275
6,693,006 B2 * 2/2004 Ho et al. ..................... 438/243

FOREIGN PATENT DOCUMENTS

JP 04-037132 * 2/1992
KR 2000020897 * 4/2000

* cited by examiner

*Primary Examiner*—George A. Goudreau
(74) *Attorney, Agent, or Firm*—Finnegan, Henderson, Farabow, Garrett & Dunner, L.L.P.

(57) ABSTRACT

A method of manufacturing a semiconductor device includes providing a wafer substrate having a surface, forming a first nitride layer over the wafer substrate, providing a layer of photoresist over the first nitride layer, patterning and defining the photoresist layer, etching the first nitride layer unmasked by the photoresist to remove at least a portion of the first nitride layer to expose at least a portion of the substrate surface, removing the photoresist layer, and depositing a second nitride layer over the first nitride layer and the exposed substrate surface to form a nitride structure having a first thickness and a second thickness, wherein the first thickness includes a thickness of the first nitride layer.

12 Claims, 1 Drawing Sheet

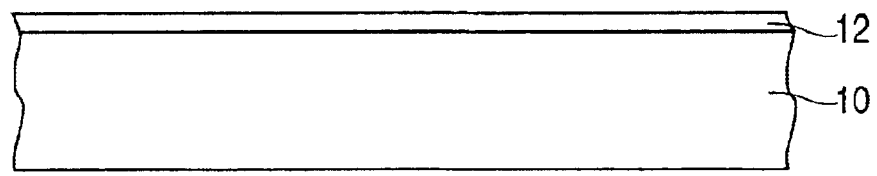
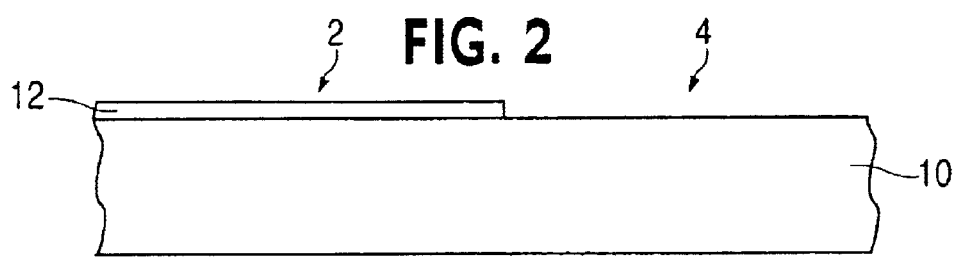
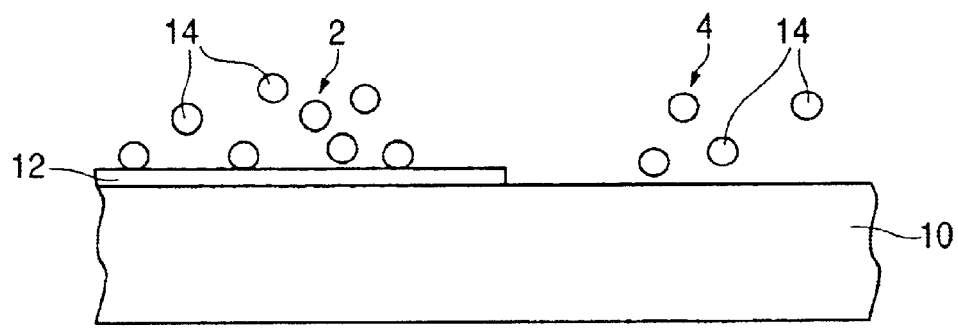
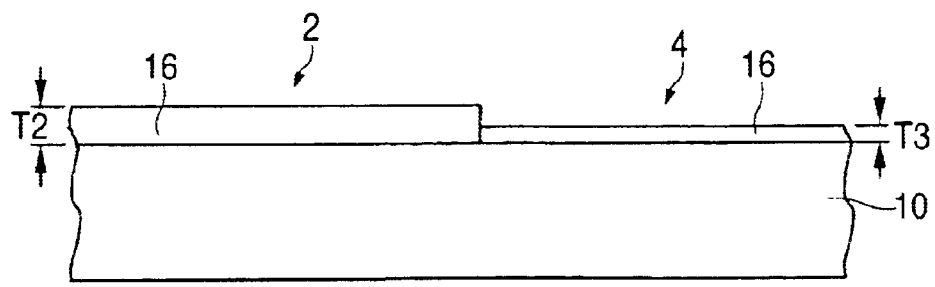

DUAL GATE NITRIDE PROCESS

FIELD OF THE INVENTION

The present invention pertains to in general a method for manufacturing a semiconductor device, and, more particularly, to a method for forming a dual gate nitride structure.

BACKGROUND OF THE INVENTION

Modern integrated circuits ("ICs") are designed to perform multiple functions. For example, many ICs include logic circuits as well as memory elements to enable the ICs to perform logic functions and store data. One conventional manufacturing process for such ICs provides multiple gate oxide thicknesses in a single oxide layer. A "dual-gate-oxide-thickness" process is one conventional manufacturing process that forms a single oxide layer with two varying thicknesses. Generally, the dual-gate-oxide-thickness process involves two oxidation steps with a masked etching step between the two oxidation steps to decrease the thickness of certain regions of the oxide layer. However, as the devices continue to be scaled to sub-micron dimensions, the etching process becomes problematic and a strong gate oxide layer becomes increasingly difficult to obtain.

Another conventional approach to providing dual gate oxide thicknesses is through nitrogen implantation because the oxidation rate may be slowed when nitrogen is present in silicon layer upon which the oxidation process takes place. Therefore, selective implantation of nitrogen will allow the formation of thicker oxide portions in non-implanted silicon regions and thinner oxide portions in nitrogen implanted silicon regions. However, nitrogen implantation sometimes creates implantation-induced defects that would be inevitably incorporated into the oxide layer through the oxidation process. These defects may degrade the gate oxide integrity. In addition, the implanted nitrogen might be unintentionally diffused further into the silicon layer during the high-temperature oxidation process. As a result, oxide thickness and uniformity become difficult to predict or control.

SUMMARY OF THE INVENTION

In accordance with the invention, there is provided a method of manufacturing a semiconductor device that includes providing a wafer substrate having a surface, forming a first nitride layer over the wafer substrate, providing a layer of photoresist over the first nitride layer, patterning and defining the photoresist layer, etching the first nitride layer unmasked by the photoresist to remove at least a portion of the first nitride layer to expose at least a portion of the substrate surface, removing the photoresist layer, and depositing a second nitride layer over the first nitride layer and the exposed substrate surface to form a nitride structure having a first thickness and a second thickness, wherein the first thickness includes a thickness of the first nitride layer.

Also in accordance with the invention, there is provided a method of manufacturing a semiconductor device that includes providing a wafer substrate having a surface, forming a first nitride layer over the wafer substrate, providing a layer of photoresist over the first nitride layer, patterning and defining the photoresist layer, etching the first nitride layer unmasked by the photoresist to remove at least a portion of the first nitride layer to expose at least a portion of the substrate surface, removing the photoresist layer, and depositing a second nitride layer over the first nitride layer and the exposed substrate surface to form a nitride structure having a first thickness and a second thickness, wherein the first thickness is different from the second thickness.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate exemplary embodiments of the invention and together with the description, serve to explain the principles of the invention.

FIGS. 1–4 are cross-sectional views of the fabrication steps consistent with one embodiment of the present invention.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

FIGS. 1–4 are cross-sectional views of the fabrication steps consistent with one embodiment of the present invention. Referring to FIG. 1, the method of the present invention starts by defining a wafer substrate 10. Substrate 10 may be any known substrate material, such as silicon. A first nitride layer 12 is grown over substrate 10 in a nitrogen environment. This is a pre-nitridation process. In one embodiment, first nitride layer 12 has a thickness of less than or equal to 11 angstroms, and is grown at a temperature ranging from approximately 700° C. to 900° C.

The ultra-thin nitride layer 12 leads to a change in the characteristics, such as surface energy, of the surface of substrate 10, such that the surface of substrate 10 exhibits the characteristics of a nitride layer. The change in the state of the substrate surface enables an accelerated deposition rate and an improved deposition ratio of the subsequent formation of a nitride layer over the nitride-like surface of the substrate, as compared to a bare substrate surface. The differences between the method of the present invention and the conventional method of providing a nitride layer over a bare silicon surface are shown in Table 1.

TABLE 1

|  | present method at 900° C. | present method at 900° C. | present method at 700° C. | bare wafer |
|---|---|---|---|---|
| First Nitride Layer Thickness | 11.3 | 7.6 | 7.8 | 0.5 |
| Nitride Thickness after Deposition | 36.1 | 32.6 | 28.9 | 18.1 |
| Deposition Rate | 3.81/min | 3.85/min. | 3.24/min. | 2.70/min. |
| Deposition Ratio | 1.41 | 1.42 | 1.21 | 1 |

The second and third columns of Table 1 show the data relative to the formation of a nitride layer in accordance with one method of the present invention performed at 900° C. The fourth column of Table 1 shows the data relative to the formation of a nitride layer in accordance with one method of the present invention performed at 700° C. The fifth column of Table 1 shows the data relative to the formation of a nitride layer in accordance with a conventional method.

Referring to Table 1, the method of the present invention first provides a first nitride layer having a thickness of 11.3', 7.6', and 7.8', respectively. In contrast, the conventional method provides a native nitride with a thickness of about 0.5'. In addition, the method of the present invention provides a thicker nitride layer than the conventional method. The formation of the thicker nitride layer is also partly due to the processing conditions of the present invention. For example with reference to Table 1, after first nitride layer 12 is formed to a thickness of 11.3' at 900° C. consistent with the method of the present invention, a nitride layer formed over first nitride layer 12 with the bare wafer would have a thickness of 18.1'. The total thickness of the two nitride layers is 29.4', which is still less than 36.1', the thickness of the nitride layer formed with the method of the present invention. Finally, the method of the present invention provides a superior deposition rate and ratio.

The method of the present invention continues by providing a layer of FINNEGAN photoresist (not shown) over first nitride layer 12. Photoresist is patterned and defined using a conventional photolithographic method. Referring to FIG. 2, region 2 of first nitride layer 12 is covered by the photoresist and region 4 of first nitride layer 12 is uncovered by the photoresist. An etch step follows with the patterned and defined photoresist as a mask. After etching, first nitride layer 12 in region 2 remains, and first nitride layer 12 in region 4 is removed. Photoresist is then removed.

Referring to FIG. 3, conventional nitridation steps follow to deposit a second layer of nitride 14 over region 2 of first nitride layer 12 and region 4, exposed surface of substrate 10. Deposition of second nitride layer 14 is performed by using low pressure chemical vapor deposition ("LPCVD") or jet vapor deposition ("JVD").

Referring to FIG. 4, after nitridation, a nitride layer 16 with two different thicknesses is formed over regions 2 and 4. Specifically, nitride layer 16 includes a first thickness T2 formed over region 2. Thickness T2 is the result of first nitride layer 12 plus nitride layer 14 deposited over first nitride layer 12 in region 2. As an example shown in Table 1, thickness T2 may have a thickness of 36.1', 32.6', or 28.9'. Nitride layer 16 also includes a thickness T3 formed over region 4. Thickness T3 is the result of nitride layer 14 formed over bare silicon substrate. An exemplary thickness for thickness T3 is 18.1' as shown in Table 1. It is desirable that thickness T2 is greater than thickness T3 plus the thickness of first nitride layer 12 formed over substrate 10.

A dual gate nitride structure is thus formed. Conventional semiconductor manufacturing processes may then follow to complete the formation of a memory device and other semiconductor structures.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of manufacturing a semiconductor device, comprising:
    providing a wafer substrate having a surface;
    forming a first nitride layer over the wafer substrate;
    providing a layer of photoresist over the first nitride layer;
    patterning and defining the photoresist layer;
    etching the first nitride layer unmasked by the photoresist to remove a portion of the first nitride layer to expose a portion of the substrate surface;
    removing the photoresist layer; and
    depositing a second nitride layer over the first nitride layer and the exposed substrate surface portion to form a nitride structure having a first thickness and a second thickness, wherein the first thickness includes a thickness of the first nitride layer, and wherein the first thickness is greater than a sum of the second thickness and the thickness of the first nitride layer.

2. The method of claim 1, wherein the thickness of the first nitride layer is about 11 angstroms.

3. The method of claim 1, wherein the thickness of the first nitride layer is less than about 11 angstroms.

4. The method claim 1, wherein the first nitride layer is grown at a temperature ranging from approximately 700° C. to approximately 900° C.

5. A method of manufacturing a semiconductor device, comprising:
    providing a wafer substrate having a surface;
    forming a first nitride layer over the wafer substrate;
    providing a layer of photoresist over the first nitride layer;
    patterning and defining the photoresist layer;
    etching the first nitride layer unmasked by the photoresist to remove a portion of the first nitride layer to expose a portion of the substrate surface;
    removing the photoresist layer; and
    depositing a second nitride layer over the first nitride layer and the exposed substrate surface portion to form a nitride structure having a first thickness and a second thickness, wherein the first thickness includes a thickness of the first nitride layer, and wherein a difference between the first thickness and the thickness of the first nitride layer is greater than a sum of the second thickness and the thickness of the first nitride layer.

6. A method of manufacturing a semiconductor device, comprising:
    providing a wafer substrate having a surface;
    forming a first nitride layer over the wafer substrate;
    providing a layer of photoresist over the first nitride layer;
    patterning and defining the photoresist layer;
    etching the first nitride layer unmasked by the photoresist to remove a portion of the first nitride layer to expose a portion of the substrate surface;
    removing the photoresist layer; and
    depositing a second nitride layer over the first nitride layer and the exposed substrate surface portion to form a nitride structure having a first thickness and a second thickness, wherein the first thickness includes a thickness of the first nitride layer, and wherein the first thickness is increased by an increase in a growing temperature of the first nitride layer.

7. A method of manufacturing a semiconductor device, comprising:
    providing a wafer substrate having a surface;
    forming a first nitride layer over the wafer substrate;
    providing a layer of photoresist over the first nitride layer;
    patterning and defining the photoresist layer;
    etching the first nitride layer unmasked by the photoresist to remove a portion of the first nitride layer to expose a portion of the substrate surface;

removing the photoresist layer; and depositing a second nitride layer over the first nitride layer and the exposed substrate surface portion to form a nitride structure having a first thickness and a second thickness, wherein the first thickness is different from the second thickness, and wherein the first thickness is greater than a sum of the second thickness and the thickness of the first nitride layer.

8. The method of claim 7, wherein the first thickness includes the first nitride layer.

9. The method of claim 7, wherein the first nitride layer has a thickness of about 11 angstroms.

10. The method of claim 7, wherein the first nitride layer is grown at a temperature ranging from approximately 700° C. to approximately 900° C.

11. The method of claim 7, wherein the first nitride layer has a thickness of less than about 11 angstroms.

12. A method of manufacturing a semiconductor device, comprising:

providing a wafer substrate having a surface;

forming a first nitride layer over the wafer substrate;

providing a layer of photoresist over the first nitride layer;

patterning and defining the photoresist layer;

etching the first nitride layer unmasked by the photoresist to remove a portion of the first nitride layer to expose a portion of the substrate surface;

removing the photoresist layer; and depositing a second nitride layer over the first nitride layer and the exposed substrate surface portion to form a nitride structure having a first thickness and a second thickness, wherein the first thickness is different from the second thickness, and wherein the first thickness is increased by an increase in a growing temperature of the first nitride layer.

\* \* \* \* \*

UNITED STATES PATENT AND TRADEMARK OFFICE
CERTIFICATE OF CORRECTION

PATENT NO. : 6,872,664 B2
DATED : March 29, 2005
INVENTOR(S) : Yung Hsien Wu

It is certified that error appears in the above-identified patent and that said Letters Patent is hereby corrected as shown below:

Column 4,
Line 19, after "method", insert -- of --.

Signed and Sealed this

Sixteenth Day of August, 2005

JON W. DUDAS
*Director of the United States Patent and Trademark Office*